United States Patent [19]

Barnett et al.

[11] 4,141,209

[45] Feb. 27, 1979

[54] CRYSTAL CONTROLLED OSCILLATOR AND METHOD OF TUNING SAME

[75] Inventors: James V. Barnett, Cupertino; Donald R. Duff, Mountain View; Larry D. Wickwar, San Mateo, all of Calif.

[73] Assignee: Fairchild Camera and Instrument Corporation, Mountain View, Calif.

[21] Appl. No.: 754,483

[22] Filed: Dec. 27, 1976

[51] Int. Cl.² ............................................. G04C 3/00
[52] U.S. Cl. .............................. 58/23 A; 58/23 AC; 331/116 R; 331/177 R; 357/51
[58] Field of Search .............. 58/23 R, 23 A, 23 AC, 58/85.5; 331/116 R, 177 R, 177 V, 179; 334/14, 15; 357/51; 338/309

[56] References Cited

U.S. PATENT DOCUMENTS

| | | | |
|---|---|---|---|
| 2,758,256 | 8/1956 | Eisler | 338/309 X |
| 3,778,998 | 12/1973 | Berney | 58/23 AC |
| 3,930,304 | 1/1976 | Keller et al. | 357/51 UX |
| 3,939,642 | 2/1976 | Morozumi | 58/23 A |
| 3,979,698 | 9/1976 | Gollinger | 58/23 A X |

Primary Examiner—Stanley J. Witkowski
Attorney, Agent, or Firm—Alan H. MacPherson; Henry K. Woodward; Paul J. Winters

[57] ABSTRACT

A network of impedance elements comprising combinations of resistors and capacitors in which the impedance of the network is modified by the selective destruction of the individual elements of the network by electrical impulses. The selective destruction of the individual elements may be planned so as to result in any combination of shorting or opening thereof.

In a specific application the frequency of the oscillator used in a digital watch is adjusted by the inclusion of a network of impedance elements, wherein the elements are then selectively destroyed in accordance with measurements of the oscillator frequency to improve the precision of oscillation. This selective destruction of elements may be done automatically by electrical means, resulting in less labor, greater speed and smaller size of the oscillator, all of which are extremely important in the manufacture of digital watches. The method also simplifies the production of digital watches.

2 Claims, 5 Drawing Figures

CRYSTAL CONTROLLED OSCILLATOR AND METHOD OF TUNING SAME

BACKGROUND OF THE INVENTION

1. Field of the Invention

The present invention generally relates to the field of electronics, and in particular to electrical oscillators and methods and means for tuning such oscillators; particularly in electrical watch applications.

2. Description of the Prior Art

The accuracy required in electronic watches and similar circuits, coupled with the small size and durability which must be maintained, dictate and use of crystal controlled oscillators. However, these oscillators must also maintain a very high precision. As used here, "accuracy" means the ability to maintain the initial oscillation rate, while "precision" means the preciseness of the original frequency setting.

Maintaining adequate accuracy is no problem with crystal-controlled oscillators, but the untuned precision of crystals is not adequate for electronic watches and in similar applications. It has proven necessary to tune such oscillators by the addition of variable amounts of parallel or series reactance. Generally, the added reactance has been capacitive, and must be adjusted after it is added to the oscillator circuit manually. Conversely, the necessary adjustment has been made by the addition of an electrically variable reactance such as a varactor, but the controlling electrical signal which varies the varactor reactance must be permanently maintained and consequently requires a manual adjustment of the controlling electrical signal. Although ways of adjusting the controlling electrical signal electronically are possible, they would be and are too cumbersome and expensive to be useful. For crystal oscillators which are to be used in electrical watches using analog displays and using digital readouts, the constraints placed on size and cost have ruled out any form of tuning to obtain the precision required except by manual adjustment in the prior art. A further disadvantage of the prior art is that the reactance elements used to tune such oscillators have been susceptible to tuning drift and have, therefore, impaired the accuracy of the crystal oscillator. This has made compromises between accuracy and precision necessary.

Thus a need exists for a tuning means which can be machine implemented with less time and labor consumption required and which is less subject to frequency drift.

BRIEF SUMMARY OF THE INVENTION

In accordance with the present invention, an oscillator suitable for use with an electrical watch is provided with a tuned circuit having a plurality of passive tuning elements which can be selectively removed from an electrical viewpoint by automated means to effect tuning. The tuning elements are comprised of resistors which may be selectively destructively removed by the passage of electrical current and capacitors which may be selectively destructively shorted by the application of an electrical voltage thereacross. By selectively destroying resistors and capacitors the oscillator may be permanently tuned by automated equipment with a minimum of intervention by an operator.

The invention and objects and future thereof will be more readily apparent from the following detailed description and appended claims when taken with the drawings.

DETAILED DESCRIPTION

Figure 1:
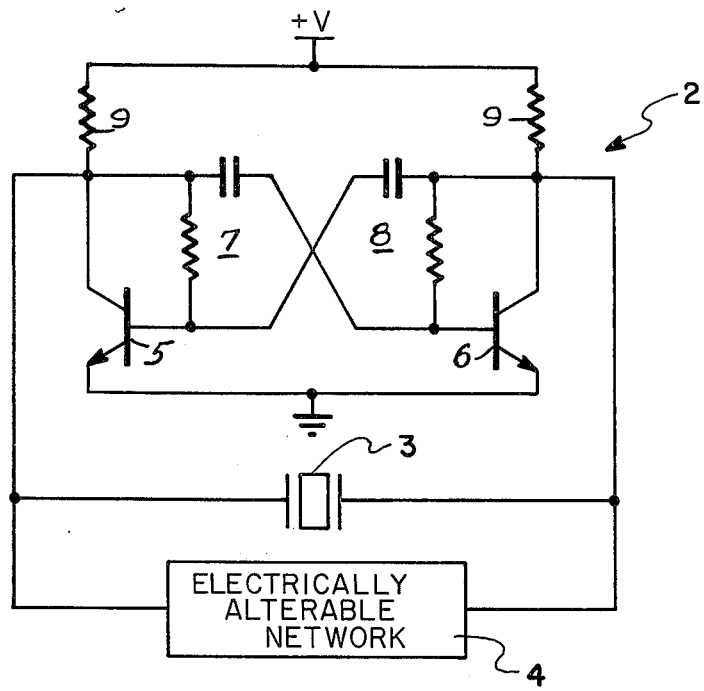
FIG. 1 is a block diagram of an electrical oscillator circuit including tuning means in accordance with the invention.

Referring to the drawings and first to FIG. 1, an oscillator 2 in the form of a transistor multivibrator circuit of the type suitable for use in an electrical watch comprising a pair of transistors 5, 6, cross-coupled by resistor-capacitor tuning elements shown generally at 7, 8, and connected to a source voltage +V by resistive elements 9, has the accuracy of its operation set by a crystal 3 as shown and the precision of the oscillator and crystal is established by a tuning or electrically alterable network or circuit 4. In the present invention, the tuning network is a network of resistors and capacitors, which network is adjusted to the correct value to precisely tune the oscillator.

Figure 2:
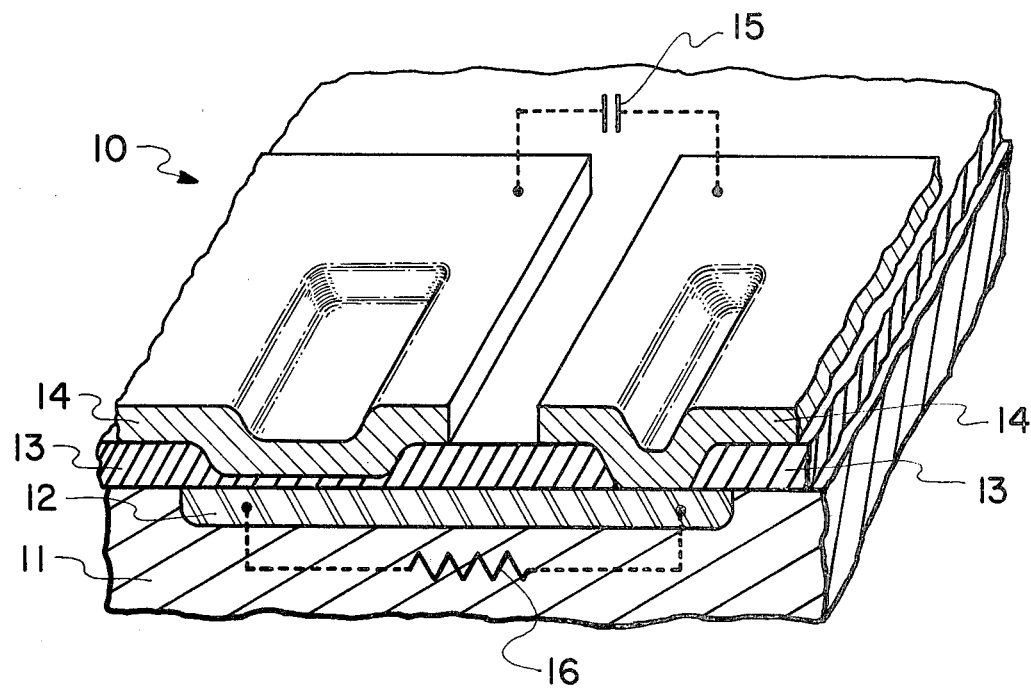
FIG. 2 is an isometric drawing of an MOS (metal-oxide-semiconductor) capacitance and a diffused resistance useful in the circuit of FIG. 1.

FIG. 2 is an isometric view of one embodiment of a destructible capacitance 15 comprising plate elements 14, which are preferably aluminum; dielectric layer 13 which is a thin layer (e.g. several hundred angstroms) of a destructible silicon oxide where the capacitance is located, and region 12 which is an impurity doped area of the silicon substrate 11 which comprises a nondestructible type resistor 16. Region 12 may typically have a $10^{18}$ atoms per cubic centimeter of dopant, either p-type of n-type, as well known in the semiconductor art.

Figure 3:
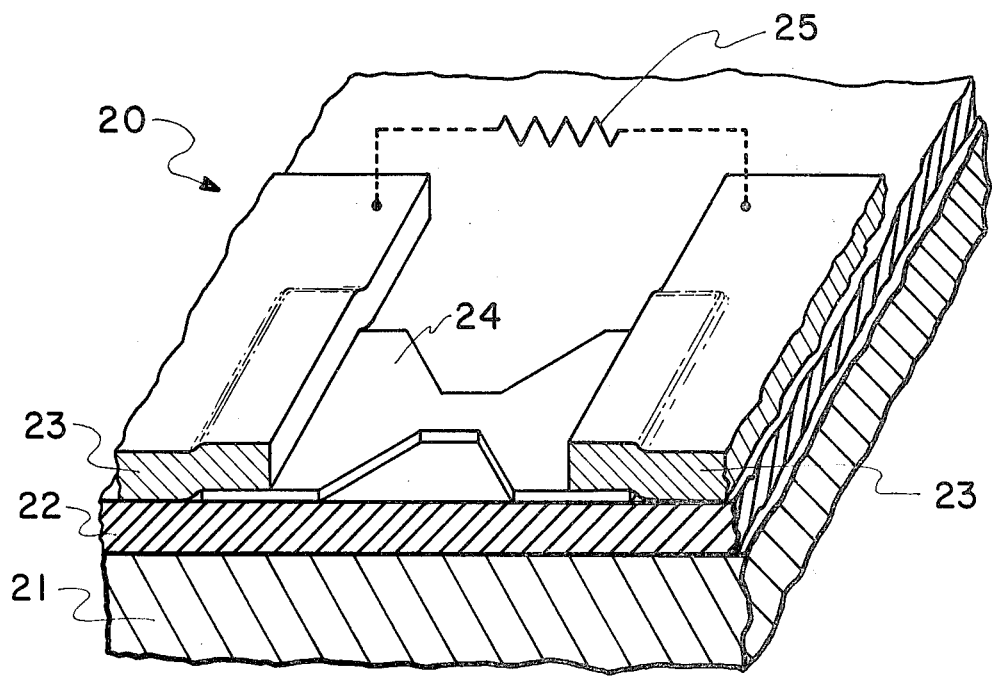
FIG. 3 is an isometric drawing of a fusible resistor in accordance with the present invention.

FIG. 3 shows an isometric view of a destructible resistance 25 comprised of elements 23 and 24, with element 24 being the destructible part, as implemented in a preferred embodiment. Element 24 is preferably comprised of nichrome or polycrystalline silicon and element 23 is composed of aluminum, both being arranged on a silicon oxide layer 22 on silicon substrate 21.

Figure 4:
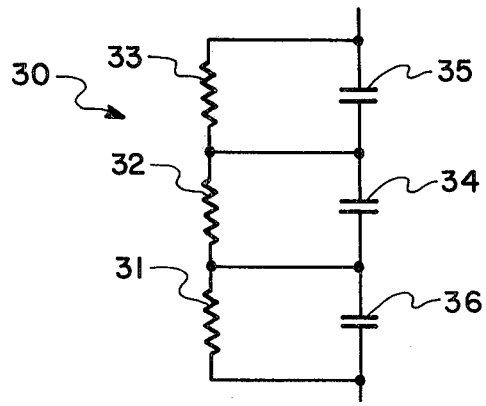
FIG. 4 is a schematic representation of fusible resistances and capacitances arranged in one specific network useful in the invention.

To illustrate the concept more fully, refer to FIG. 4 where resistances 31, 32 and 33 are arranged across capacitances 36, 34 and 35. Any or all of elements 31 through 36 may be destructible so as to allow the modification of this network by selective destruction of resistors or capacitors such as by opening resistance 31, 32 or 33 or by shorting capacitance 36, 34 or 35 or any combination thereof. Such selective destruction is achieved by the passage of excessive electrical current through a resistance element and the application of excessive voltage across a capacitance element.

Figure 5:
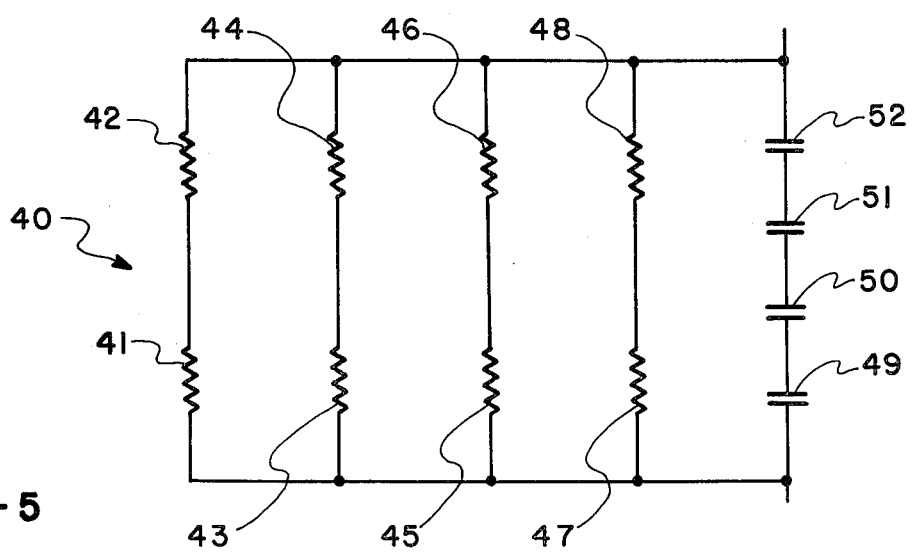
FIG. 5 is a schematic representation of fusible and diffused resistances and of capacitances in an alternate network useful in the invention.

As a further illustration of this concept, refer to circuit 40 shown in FIG. 5, where destructible resistances 41, 43, 45 and 47 are arranged in series with nondestructible resistances 42, 44, 46 and 48 so as to allow combinations 41–42 or 43–44 or 45–46 or 47–48 or any combination of these to be removed by selectively destroying resistances 41, 42, 45 or 47. Note that 42, 44, 46 and 48 may be utilized to provide electrical isolation during the selective destruction of 41, 42, 45 or 47 by restricting the voltage and current applied to unselected elements, as well as providing additional resistance to the network. In the same FIG. 5 destructible capacitances 49 through 52 may be selectively destroyed by shorting to modify the impedance of the network thereby.

The described oscillator and method of tuning offers improved accuracy with reduced manufacturing costs. While the invention has been described with reference to illustrative embodiments, the description is not to be construed as limiting the invention. Various modifications and changes may occur to those skilled in the art without departing from the true spirit and scope of the invention as defined by the appended claims.

We claim:

1. A crystal controlled oscillator circuit such as are used for electronic watches and the like which can be automatically adjusted by electrical impulses comprising:
    (a) a transistor multivibrator circuit,
    (b) a quartz crystal operably connected with said transistor multivibrator circuit to stabilize the operating frequency of said multivibrator, and
    (c) a tuning circuit operably connected with said crystal and said multivibrator circuit to adjust said operating frequency, said tuning circuit including an arrangement of electrically alterable resistors and capacitors each of which may be selectively destroyed by electrical impulses to alter the characteristics of said turning circuit and thereby adjust the frequency of said multivibrator circuit.

2. An arrangement as in claim 1 wherein said electrically alterable resistors and capacitors are used to connect and disconnect other elements of said tuned circuit to adjust the frequency of said oscillator.

* * * * *